United States Patent [19]

Nakano et al.

[11] 4,430,400

[45] Feb. 7, 1984

[54] METHOD OF PRODUCING COLOR FILTERS USING DEHYDRATING SOLUTION

[75] Inventors: Toshio Nakano, Tokyo; Yoshio Taniguchi, Hino; Ken Tsutsui, Tokyo; Akira Sasano, Tokyo; Tadeo Kaneko, Nishitama; Akiya Izumi, Mobara; Michiaki Hashimoto, Yono, all of Japan

[73] Assignee: Hitachi, Ltd., Tokyo, Japan

[21] Appl. No.: 304,153

[22] Filed: Sep. 21, 1981

[30] Foreign Application Priority Data

Sep. 19, 1980 [JP] Japan ................... 55-129320

[51] Int. Cl.³ ................... G03F 5/00; G03C 5/00
[52] U.S. Cl. ................... 430/7; 430/325; 430/330; 430/331
[58] Field of Search ................... 430/264, 321, 7, 325, 430/331, 330

[56] References Cited

U.S. PATENT DOCUMENTS

| 3,617,274 | 11/1971 | Lin | 350/3.5 |
| 3,660,091 | 5/1972 | Shankoff et al. | 350/3.5 |
| 4,081,277 | 3/1978 | Brault et al. | 430/235 |
| 4,285,007 | 8/1981 | Nakano et al. | 430/4 |
| 4,311,773 | 1/1982 | Kaneko et al. | 430/7 |

FOREIGN PATENT DOCUMENTS

| 48592 | 3/1982 | European Pat. Off. |
| 55-115371 | 5/1980 | Japan |

OTHER PUBLICATIONS

Chang, S.P.I.E., vol. 177, 1979, pp. 71-74, 80 and 81.
Samollovich et al., Photo. Sci. and Engrg., vol. 24, No. 3, May/Jun. 1980, pp. 161-166.
Brandes et al., Applied Optics, vol. 8, No. 11, 11/1969, pp. 2346-2348.
Meyerhofer, Applied Optics, vol. 10, No. 2, 2/1971, pp. 416-421.
Meyerhofer, "Phase Holograms in Dichromated Gelatin", RCA Review, vol. 33, 3/1972, pp. 110-124.
Chang et al., Applied Optics, vol. 18, No. 14, 7/1979, pp. 2407-2417.
Land, "An Introduction to Polarvision", Photo. Sci. and Engrg., vol. 21, No. 5, Sep./Oct. 1977.
Shankoff, Applied Optics, vol. 7, No. 10, 10/1968, pp. 2101-2105.
Shankoff et al., Applied Physics Letters, vol. 13, No. 7, 10/1968, pp. 239-241.
Lin, Applied Optics, vol. 8, No. 5, 5/1969, pp. 963-965.

Primary Examiner—Richard L. Schilling
Attorney, Agent, or Firm—Antonelli, Terry & Wands

[57] ABSTRACT

Disclosed is a method of producing color filters, which comprises forming a layer of an organic polymeric material having a predetermined light-sensitive characteristic on a substrate, exposing this layer to a predetermined pattern, developing the exposed layer to form a filter base and dyeing the filter base, wherein after the development of the exposed layer, the layer is wetted with a dehydrating solution to remove water from the filter base. By this dehydrating treatment, the filter base can be processed with very high precision.

16 Claims, 16 Drawing Figures

METHOD OF PRODUCING COLOR FILTERS USING DEHYDRATING SOLUTION

BACKGROUND OF THE INVENTION

(1) Field of the Invention

The present invention relates to a method of producing color filters. More particularly, the present invention relates to a method of producing color filters having an improved filter base.

(2) Description of the Prior Art

Color filters comprising an organic material have been used for image pickup devices such as solid state color image pickup devices and single color image pickup tubes. These color filters have heretofore been prepared by adding ammonium dichromate to an organic polymeric material such as polyvinyl alcohol (ordinarily referred to as "PVA"), gelatin or casein to form a filter base having a light sensitivity, subjecting the filter base to imagewise exposure through a mask pattern and to development and drying the filter base. According to this method, warm water or the like is used at the development step, and after rinsing, the filter base is dried under rotation by using a spinner. The filter base absorbs a large quantity of water at the development step to increase the volume thereof by swelling. Ordinarily, the above-mentioned rotational drying is adopted for removing water from the filter base after the development step. According to this method, however, when water is scattered at a high speed, the filter base is deformed, and the original shape is not restored by drying. This results in distortion of the pattern and a precise pattern cannot be obtained.

The following prior art references are cited to show color filters:

U.S. Pat. No. 4,081,277
U.S. Pat. No. 3,623,794
"Integral Color Filter Arrays for Solid State Imagers", DIGEST OF INTERNATIONAL ELECTRON DEVICE METTING, December 1970, page 460

SUMMARY OF THE INVENTION

Figure 1:
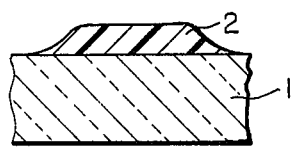
FIG. 1 is a sectional partial view illustrating a color filter prepared according to the conventional method.

According to the present invention, a film having a predetermined light-sensitive characteristic is formed on a substrate, the film is exposed to light through a predetermined pattern and the exposed film is subjected to a development treatment to form a filter base. When the filter base is dyed to form a color filter, the film is wetted with a dehydrating solution after the development treatment to remove water from the filter base. By this treatment, the filter base can be processed with very good precision.

DETAILED DESCRIPTION OF THE INVENTION

The most characteristic feature of the present invention is that an organic polymeric material having a light sensitivity is formed into a filter base, the filter base is subjected to a development treatment to give a predetermined shape to the filter base and the filter base is wetted with a dehydrating solution such as an alcohol. As a typical instance of the dehydrating solution, there can be mentioned a solution containing at least one member selected from the group consisting of alcohols.

When the filter base is wetted with the dehydrating solution, water contained in the wetted and swollen filter base is dissolved out into the solution. Since the filter base has no affinity with the alcohol in the solution, the filter base is shrunk and the sharp shape just after the development treatment is restored precisely. As the alcohol, there can be mentioned monohydric alcohols such as methanol, ethanol, 1-propanol, 2-propanol, 1-butanol, 2-butanol, tert-butyl alcohol, 1-heptanol, 2-heptanol and 4-heptanol, and dihydric alcohols such as ethylene glycol, 1,2-propanediol, 1,3-propanediol, 1,3-butanediol, 1,4-butanediol, 2,3-butanediol, 1,2-butanediol, 1,5-pentanediol, 1,6-hexanediol and 2,5-hexanediol.

The dehydrating solution is used at 0° to 40° C. Ordinarily, it is used at room temperature. If the temperature exceeds 40° C., evaporation is made vigorous and the solution is consumed in large quantities. Accordingly, such high temperatures should be avoided. Furthermore, if the temperature is lower than 0° C., the dehydrating property is drastically reduced. Therefore, such low temperatures cannot be used. Anhydrous ethanol, anhydrous methanol and other anhydrous alcohols may directly be used as the dehydrating solution. Furthermore, commercially available products having an alcohol content higher than 90% may also be used. When the dehydrating reaction of the filter base is violent so that there is a fear of degradation of the base by deformation or deterioration, it is necessary to use the dehydrating solution after dilution. Ordinarily, the dehydrating solution is diluted with water by 50 to 90%. Of course, when it is necessary to control the dehydrating reaction, the solution may further be diluted. Needless to say, the effect of controlling the dehydrating reaction may be attained by lowering the temperature of the solution. When the dehydrating reaction is thus controlled, the speed of shrinkage of the filter base such as gelatin is moderated, and occurrence of abnormal distortion in the base can be prevented and a filter base having a precise pattern can be obtained. It has been found that even when the above-mentioned dehydrating solution is poured onto the filter base, the intended effect can similarly be attained.

FIG. 1 is a sectional view showing a stripe filter of the filter base prepared according to the conventional method. The end portion of the filter base hangs down and when such filter base is used, the resolving power is reduced in the image pickup device. In contrast, as is shown in the sectional view of FIG. 2g, the end portion of the filter base prepared according to the present invention is precisely shaped.

The so-prepared filter base is dyed according to the known dyeing technique to obtain a color filter. When a multi-color filter is prepared, the filter of the first color is coated with a color mingling-preventing film (ordinarily, an intermediate layer) according to need, and a filter base of the second color is formed thereon to have a predetermined pattern and then dyed. This procedure is repeated to obtain a multi-color filter.

Dyeing of the filter base is accomplished by permeation of a dye into the filter base. The operation of wetting the filter base with the alcohol is performed for several seconds to about 30 minutes, and from the viewpoint of the operation efficiency, it is preferred that this wetting operation be carried out for scores of seconds to about 5 minutes.

When after wetting with the alcohol solution, the solution is drained off and the filter base is baked for 5 to 40 minutes in an atmosphere maintained at 100° to 300° C., if the filter base is wetted with the dye solution after solidification, swelling is not caused and good results can be obtained.

Furthermore, when the alcohol solution is diluted with water and the filter base is wetted with the diluted solution, shrinkage of the filter base is moderated to prevent occurrence of distortion in the filter base, and therefore, a filter base having good quality can be obtained.

When the filter base is dehydrated by wetting it with alcohol solutions one by one while increasing the alcohol content gradually so as to prevent abrupt shrinkage of the filter base, distortion is not caused and a pattern can be formed with a high resolving power.

As the filter base, there can be used organic polymeric materials such as gelatin, casein, fish glue and PVA. In order to impart a light sensitivity to the filter base, a dichromate or azide compound is added to the filter base in an amount of 1 to 30% by weight, ordinarily about 5% by weight.

The present invention will now be described with reference to specific embodiments.

FIGS. 2a through 2g are sectional views illustrating diagrammatically the steps of one embodiment of the method of producing a color filter according to the present invention.

Figure 2A:
FIGS. 2a through 2g are views diagrammatically illustrating the steps of one embodiment of the method of producing color filters according to the present invention.
Figure 2B:
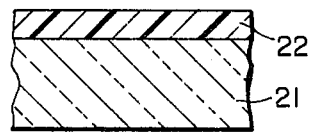
Figure 2C:
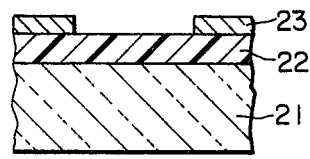
Figure 2D:
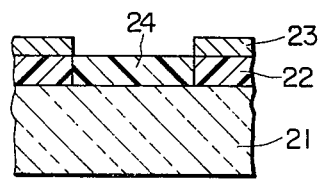
Figure 2E:
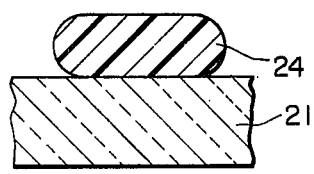

Referring to FIG. 2a, photosensitive gelatin is coated in a thickness of 0.3 to 0.5 $\mu$m on a transparent glass substrate 21 to form a filter base as shown in FIG. 2b. In addition to gelatin, there can be used albumene, glue, casein and polyvinyl alcohol as the filter base as pointed out hereinbefore. A dichromate has been added to this filter base to render it photosensitive. An azide compound may also be used for the same purpose. Then, as shown in FIG. 2c, the filter base is exposed to ultraviolet rays or the like through a light-shielding mask 23 having a predetermined shape. This mask need not always be brought into close contact with the filter base 22, but it is sufficient if exposure is effected with a predetermined pattern, for example, a stripe pattern or mosaic pattern. As shown in FIG. 2d, a latent image portion 24 is formed partially on the filter base 22 by the above exposure. In this latent image portion, the base is crosslinked and solidified by the light energy or the like at the exposure step. Then, as shown in FIG. 2e, the base 24 is developed with a developing liquid composed of warm water maintained at 20° to 60° C. The development is accomplished by washing the filter base with the developing liquid for 1 to 5 minutes. Then, the base 24 is rinsed with water maintained at 10° to 25° C. for 1 to 10 minutes.

Figure 2F:
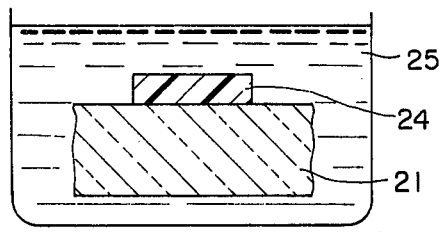
Figure 2G:
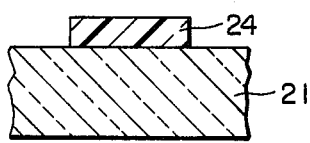

The filter base 24 absorbs water as shown in the drawings at this water washing treatment and the filter base 24 is thus swollen. The pattern of the swollen filter base is larger in the size than the mask pattern, and needless to say, no good results can be obtained if the filter base is used in this state. This swelling is caused by the water-absorbing or moisture-absorbing property of the organic polymeric material such as gelatin and ordinarily results in a volume expansion of scores to several hundreds of %. Then, as shown in FIG. 2f, the swollen gelatin is dipped in a methanol solution 25. In this embodiment, the dipping time is adjusted to about 5 minutes. When the swollen gelatin 24 is thus dipped in the methanol solution 25, water in the swollen gelatin 24 is promptly extracted into the methanol solution. Since water is thus expelled, the swollen gelatin 24 is gradually shrunk and the size of the pattern at the exposure step is restored. Since any mechanical or thermal force is not applied from the outside at all for shrinkage, no distortion of the pattern is caused and a clear peripheral edge portion is restored precisely. Then, as shown in FIG. 2g, the gelatin 24 is taken out from the alcohol solution 25 and the alcohol is removed therefrom to obtain a filter base 24 to be dyed. The base is dyed according to the customary dyeing method to obtain a predetermined color filter.

According to the above-mentioned embodiment, when the thickness of the gelatin film is 1.5 $\mu$m, stripe gelatin films having a width of 15 $\mu$m are obtained at intervals of 7 $\mu$m. In contrast, according to the above-mentioned conventional method, intervals of 15 $\mu$m are necessary for obtaining the same stripe gelatin films because the end portions of the gelatin films hang down. Thus, the interval between two adjacent stripe gelatin films can be reduced to ½ according to the above embodiment of the method of the present invention.

Similar results are obtained when alcohols shown in Table 1 are used as the dipping solution instead of methanol.

TABLE 1

| Solution No. | Component 1 | Component 2 |
|---|---|---|
| 1 | methanol | ethanol |
| 2 | " | propanol |
| 3 | " | butanol |
| 4 | " | heptanol |
| 5 | " | hexanol |
| 6 | " | propanediol |
| 7 | ethanol | — |
| 8 | " | propanol |
| 9 | " | butanol |
| 10 | " | hexanol |
| 11 | propanol | — |
| 12 | ethylene glycol | — |
| 13 | propanediol | — |
| 14 | butanediol | — |
| 15 | pentanediol | — |
| 16 | hexanediol | — |

Liquid mixtures of components 1 and 2 as shown in Table 1 may be used, and the intended effects can similarly be attained. The mixing volume ratio of the components 1 and 2 may be adjusted to, for example, 8:2. Furthermore, mixtures of these alcohols with water can be used.

According to another embodiment of the present invention, the filter base which is taken out from the alcohol solution is baked at 100° to 300° C. for 5 to 60 minutes. In this embodiment, a filter base having a highly improved quality can be obtained. When baking is effected, evaporation of the alcohol is promoted, and the filter base is appropriately solidified. Therefore, if the filter base is wetted with the dye solution afterward, swelling hardly occurs and distortion of the pattern by swelling at the dyeing step can be prevented. Since dyeing is ordinarily performed by dipping the filter base in an ordinary dye solution as described hereinafter, if the filter base is baked at too high a temperature for too long a time, intrusion of the dye is inhibited by excessive solidification and compaction. Accordingly, it is necessary to perform the baking operation under the above-mentioned conditions. Furthermore, when the developed gelatin pattern is dipped in an alcohol solution diluted with water by 50 to 90% and the dehydrating treatment is performed by increasing the concentration gradually stepwise in alcohol solutions to be used in sequence for dehydration, very good results can be obtained. In the water-diluted alcohol solutions, the speed of shrinkage of gelatin is moderated and distortion of the filter base is advantageously prevented.

Figure 3:
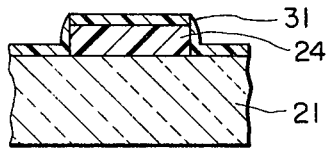
FIGS. 3 and 5 are sectional partial views illustrating another color filters according to the present invention.

FIG. 3 illustrates another embodiment of the method of the present invention. According to this embodiment, a dyeing-improving layer 31 is formed on the filter base 24. An organic polymeric material used for the dyeing-improving layer 31. It is important that the refractive index of the layer 31 should be the same as or very close to that of the filter base. Is this dyeing-improving layer is formed, surface roughening of gelatin by shrinkage due to dipping dehydration by the alcohol solution or scattering of light by convexities or concavities formed on the surface of gelatin can be prevented, and a good color filter free of irregular reflection can be obtained. The thickness of this dyeing-improving layer may be adjusted to about 0.5 to about 2 μm.

FIGS. 4a through 4f illustrate still another embodiment of the method of the present invention.

A filter base 44 to be dyed is prepared according to the steps of the foregoing embodiment shown in FIGS. 2a through 2g. More specifically, gelatin is exposed and developed to obtain a predetermined pattern. Then, the gelatin pattern is dipped in a solution of an alcohol such as ethanol at room temperature to shrink the gelatin swollen at the development step so that the predetermined pattern is restored in the gelatin. Then, the shrunk gelatin is baked at 200° C. for 10 minutes and then transferred to the dyeing step described hereinafter. When a plurality of color filters are formed, the step of forming the filter base and the dyeing step are repeated in sequence. For simplification of the explanation, description of the repeated portions of the steps is omitted.

Figure 4A:
FIGS. 4a through 4f are views diagrammatically illustrating the steps of another embodiment of the method of producing color filters according to the present invention.
Figure 4B:
Figure 4C:
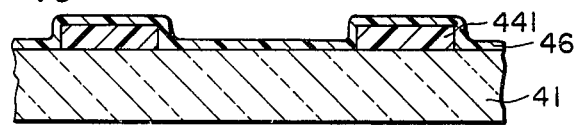

In the first place, a layer of a color filter base of gelatin or the like which has been rendered photosensitive is formed on a glass substrate 41. Only a portion of the first color is photo-cured by the mask light exposure method and development is carried out. As the result, only the portion 44 of the filter base is left. In the same manner as described hereinbefore, the filter base 44 is solidified by baking. Then, as shown in FIG. 4b, the portion 44 is dyed with a dye having a predetermined spectral characteristic according to the method described hereinafter to form a color filter 441. Then, as shown in FIG. 4c, an intermediate layer 46 having a resistance to dyeing is formed by coating. A thermally crosslinkable or radioactive ray-sensitive polymeric material is used for formation of this intermediate layer 46.

In the present invention, PGMA [poly(glycidyl methacrylate)] is used for the intermediate layer and protecting film layer (topmost intermediate layer). The thickness of the filter base is 0.3 to 5 μm, the thickness of the intermediate layer is 0.3 to 1.5 μm, and the thickness of the protecting film layer was 0.5 to 2 μm. After the above-mentioned thermally crosslinkable or radioactive ray-sensitive polymeric material has been coated, heating is carried out at 200° C. for 20 minutes. Of course, other heating conditions, for example, 180° C. and 20 minutes, may be adopted.

Dyeing solutions to be used for formation of color filters are, for example, as described below.

(a) Compounding of Dyes

| Green: | |
| --- | --- |
| Chrysophenine Yellow | 0.15% by weight |
| Lissamine Green | 0.8% by weight |
| acetic acid | 0-5% by weight |
| water | balance |
| Blue: | |
| Methyl Blue | 1% by weight |
| acetic acid | 0-5% by weight |
| water | balance |
| Red: | |
| Diacid II Fast Red 3BL | 0.3% by weight |
| Kayanol Yellow N5G | 0.2% by weight |
| acetic acid | 0-5% by weight |
| water | balance |

(b) Dyeing Conditions

| Color | Temperature | Time |
| --- | --- | --- |
| green | 0-75° C. | 2 minutes |
| blue | 0-75° C. | 1 minute |
| red | 0-75° C. | 2 minutes |

Needless to say, the dyeing conditions are not limited to those described above, but other temperature and time can be adopted appropriately.

Figure 4D:
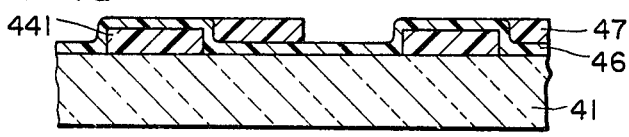

Then, as shown in FIG. 4d, a layer of a color filter base is formed, exposed to light according to the mask exposure method and developed, if necessary, to form a filter portion 47 of the second color, and the filter portion 47 is dyed with a dye having a predetermined spectral characteristic.

Figure 4E:
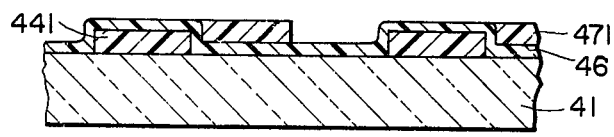
Figure 4F:
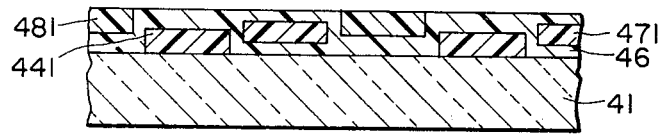

The above procedures are repeated to form color filters 471 and 481 as shown in FIGS. 4e and 4f. Then, a protecting film layer 46 is formed. PGMA is similarly used for formation of this layer 46.

A three-color filter is prepared through the above-mentioned steps.

Also in the present embodiment, since the filter base is dipped in a dehydrating solution of an alcohol, distortion of the pattern in the swollen filter base is prevented when it is shrunk. Therefore, a filter base can be formed without any shear or distortion in the pattern. Accordingly, even if a plurality of filters are lapped, a clear image can be provided without divergence of the colors.

In addition to the above-mentioned PGMA, there may be used poly(methyl methacrylate), poly(methyl isopropenylketone), poly(methyl methacryamide), poly(hexafluorobutyl methacrylate) and poly(butene-1-sulfone) as the radioactive ray-sensitive polymeric material for the intermediate layer.

Furthermore, a thermally crosslinkable polymeric material such as epoxidized 1,4-polybutadiene, epoxidized polyisoprene, epoxidized polybutadiene or polyacrylamide may be used and it may be incorporated into the above-mentioned radioactive ray-sensitive polymeric material.

Figure 5:
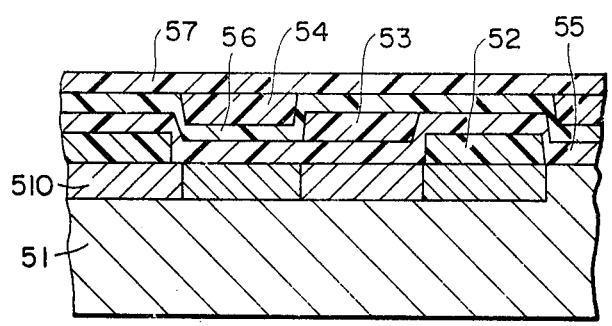

FIG. 5 is a diagram illustrating an embodiment in which the present invention is applied to production of a color filter for a solid state image pickup device.

A filter base 52 to be dyed is prepared according to the steps of the foregoing embodiments. More specifically, gelatin is exposed to light to form a predetermined pattern and is then developed. Then, the gelatin swollen at the development step is dipped in a solution of an alcohol such as ethanol at room temperature to shrink the swollen gelatin to the predetermined pattern. Then, the gelatin is baked at 200° C. for 10 minutes and transferred to the dyeing step. When a plurality of color filters, such as red, blue and green filters, are formed, the above-mentioned steps of forming the filter base and dyeing the filter base are repeated in sequence. For simplification of the explanation, description of the repeated portions of the steps is omitted.

In the present embodiment, the substrate 51 is a substrate of a solid state color image pickup device. Many light-detecting portions 510 are formed on the substrate 51 of the solid state color image pickup device. Ordinarily, the substrate 51 is formed of silicon. The light-detecting portions are formed of the same material as a semiconductor integrated circuit constituting a peripheral circuit for actuating the light-detecting portions or they may be formed of a different semiconductor material.

In FIG. 5, reference numerals 52, 53 and 54 represent filter bases constituting color filter portions, reference numerals 55 and 56 represent intermediate layers, and reference numeral 57 represents a protecting film layer.

At the dyeing step for formation of color filters, compounding of dyes, contents of dyes, the temperature of a dyeing solution and the dyeing time are appropriately determined.

Specific examples of the filter base, intermediate layer and protecting film layer are shown in Table 2.

TABLE 2

| Run No. | Filter Base | | | Intermediate and Protecting Layers | | |
|---|---|---|---|---|---|---|
| | Material | Light-Sensitivity Characteristic | Exposure Time | Material | Light-Sensitivity Characteristic | Exposure Time |
| 1 | gelatin | 250–440 nm* | 10 seconds | poly(glycidyl methacrylate) | electron beams-250 nm | 6 minutes |
| 2 | gelatin | 250–440 nm* | 10 seconds | poly(methyl methacrylate) | electron beams-250 nm | 2 minutes |
| 3 | gelatin | 250–440 nm* | 10 seconds | poly(methyl isopropenyl-ketone) | electron beams, 230–320 nm | 20 seconds |
| 4 | polyvinyl alcohol | 250–440 nm* | 10 seconds | poly(glycidyl methacrylate) | electron brams-250 nm | 6 minutes |
| 5 | glue | 250–440 nm* | 10 seconds | poly(methyl methacrylamide) | electron beams | 10 minutes |
| 6 | gelatin | 250–440 nm* | 10 seconds | poly(hexafluorobutyl methacrylate) | X-rays | 10 minutes |

(1) Compounding of Dyes

| Green: | |
|---|---|
| Sirius Yellow GC | 0.1% by weight |
| Lissamine Green V | 0.4% by weight |
| acetic acid | 0–0.15% by weight |
| water | balance |
| Blue: | |
| Methyl Blue | 1% by weight |
| acetic acid | 0–0.15% by weight |
| water | balance |
| Red: | |
| Poncean S | 0.3% by weight |
| Kayanol Yellow N5G | 0.08% by weight |
| acetic acid | 0–0.15% by weight |
| water | balance |

(2) Dyeing Temperature and Time

| Green: |
|---|
| 40–60° C., 2 minutes |
| Blue: |
| 40–60° C., 1 minute |
| Red: |
| 40–60° C., 2 minutes |

Among the foregoing radioactive ray-sensitive materials, poly(glycidyl methacrylate), poly(methyl methacrylamide) and a methyl methacrylate/methacryloyl chloride copolymer which belongs to the methyl methacrylate copolymer are thermally crosslinkable materials.

In the case of such thermally crosslinkable material, if heating is effected at a temperature causing thermal crosslinking after coating of the intermediate layer, the water resistance of the intermediate layer is improved and the intermediate layer acts as the dyeing-resistant layer more effectively.

If the above heating is carried out at about 200° C. for about 15 minutes, polymerization by crosslinking is considerably advanced and the above-mentioned improvement of the water resistance can be attained.

Also in the present embodiment, since the filter base is dehydrated in the alcohol solution, distortion of the pattern is not caused. Accordingly, the present invention can be applied to a special substrate such as that of a solid state image pickup device and a clear image can be formed without shear of the colors in the pattern.

The method of the present invention can advantageously be applied to production of color filters of the complementary color system. For example, the first color filter is of the cyan color, and the second color filter is of the yellow color, a part of which is superimposed on the color filter of the cyan color. The green color is sensed by the superimposed portion of the color filters of the cyan color and yellow color. There may be considered various kinds of color filters and various combinations thereof, and the present invention can be applied to all of these color filters and combinations thereof. Also in the present embodiment, the respective color filter portions can be formed clearly and distinctly because the ends of the base filter do not hang down in any of the respective color filter portions.

As will be apparent from the foregoing description, according to the present invention, since the filter base is dipped in a dehydrating solution having no affinity with the filter base after development, a color filter free of distortion of the pattern can be provided. In this point, the present invention is very advantageous from the industrial viewpoint. In the foregoing embodiments, image pickup color filters are explained. Needless to say, color filters to be produced by the present invention are not limited to these color filters, but color filters to be used for other various optical devices and display devices can be produced according to the present invention. Furthermore, alcohols are mainly described as the dehydrating solution having no affinity with the filter base. Needless to say, other solutions having such characteristics can similarly be used in the method of the present invention. In the foregoing embodiments, development of the exposed filter base which is conducted by using warm water is described in detail. However, the present invention also includes an embodiment in which a latent image is developed with a predetermined liquid developer and the filter base is then washed with water.

What is claimed is:

1. A method of producing color filters, which comprises the steps of forming a layer of an organic polymeric material having a predetermined light-sensitive characteristic on a substrate, exposing the layer of the organic polymeric material to a predetermined pattern, developing the exposed layer of the organic polymeric material to form a filter base and dyeing the filter base, wherein after the development of the layer of the organic polymeric material but before said dyeing, said filter base is wetted with at least one dehydrating solution, and wherein after the step of wetting the filter base with the at least one dehydrating solution, said filter base is heated in an atmosphere maintained at 100° to 300° C.

2. A method of producing color filters according to claim 1, wherein the at least one dehydrating solution contains at least one member selected from the group consisting of alcohols.

3. A method of producing color filters according to claim 1, wherein the substrate is a substrate for a light-receiving device having at least a light-receiving portion.

4. A method of producing color filters according to claim 1, wherein the at least one dehydrating solution contains water and at least one member selected from the group consisting of alcohols.

5. A method of producing color filters according to claim 2, wherein said alcohol is selected from the group consisting of methanol, ethanol, 1-propanol, 2-propanol, 1-butanol, 2-butanol, tert-butyl alcohol, 1-heptanol, 2-heptanol, 4-heptanol, ethylene glycol, 1,2-propanediol, 1,3-propanediol, 1,3-butanediol, 1,4-butanediol, 2,3-butanediol, 1,2-butanediol, 1,5-pentanediol, 1,6-hexanediol and 2,5-hexanediol.

6. A method of producing color filters according to claim 1, wherein the at least one dehydrating solution is at a temperature of 0°–40° C.

7. A method of producing filter colors according to claim 1, wherein the filter base is heated for 5–60 minutes.

8. A method of producing color filters according to claim 2, wherein the filter base has no affinity for said dehydrating solution.

9. A method of producing color filters according to claim 1, wherein the filter base has no affinity for said dehydrating solution.

10. A method of producing color filters according to claim 1, comprising the further steps, after dyeing said filter base, of coating said filter base and substrate with a color mingling-preventing film, then forming a second layer of an organic polymeric material having a predetermined light-sensitive characteristic on said color mingling-preventing film, then exposing the second layer to a predetermined pattern, and developing the exposed second layer to form a second filter base and dyeing the second filter base, and wherein, after the development of the second layer but before said dyeing, said second layer is wetted with a dehydrating solution.

11. A method of producing color filters according to claim 10, wherein said color mingling-preventing film is made of a material selected from the group consisting of poly(glycidyl methacrylate), poly(methyl methacrylate), poly(methyl isopropenylketone), poly(methyl methacryamide), poly(hexafluorobutyl methacrylate) and poly (butene-1-sulfone).

12. A method of producing color filters according to claim 1, wherein said filter base includes parts of the layer of an organic polymeric material separated from each other.

13. A method of producing color filters according to claim 1 or 6, wherein the filter base is wetted with the at least one dehydrating solution for a period of time of several seconds to about 30 minutes.

14. A method of producing color filters according to claim 13, wherein the filter base is heated for 5 to 60 minutes.

15. A method of producing color filters according to claim 1, wherein the filter base is wetted with the at least one dehydrating solution by wetting said filter base successively with a plurality of dehydrating solutions containing water and alcohol, with each successive dehydrating solution containing a greater content of alcohol.

16. A method of producing color filters according to claim 1, wherein said organic polymeric material is selected from the group consisting of gelatin, albumene, casein, glue and polyvinyl alcohol.

* * * * *